(12) United States Patent
Breisch et al.

(10) Patent No.: US 6,686,819 B2
(45) Date of Patent: Feb. 3, 2004

(54) DUAL REFERENCED MICROSTRIP

(75) Inventors: James Breisch, Chandler, AZ (US);
Chee-Yee Chung, Chandler, AZ (US);
Alex Waizman, Zichron Yaakov (IL);
Teong Guan Yew, Perak (MY)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 10/060,363

(22) Filed: Feb. 1, 2002

(65) Prior Publication Data

US 2003/0146811 A1 Aug. 7, 2003

(51) Int. Cl.[7] .................................................. H01P 1/00
(52) U.S. Cl. ......................... 333/247; 333/238; 333/33
(58) Field of Search ........................... 333/247, 33, 32, 333/236, 238, 246

(56) References Cited

U.S. PATENT DOCUMENTS 6,477,060 B1 * 11/2002 Peter et al. ................. 361/795
6,538,603 B1 * 3/2003 Chen et al. ................. 342/372

* cited by examiner

Primary Examiner—Robert Pascal
Assistant Examiner—Kimberly E Glenn
(74) Attorney, Agent, or Firm—Kenyon & Kenyon

(57) ABSTRACT

Structures and methods are provided for dual referenced microstrip structures having low reference discontinuities between a microstrip trace referenced to a primary reference plane as compared to a microstrip trace referenced to a secondary reference plane. A method, according to one embodiment of the invention, includes the calculation of a first characteristic impedance of the dual referenced microstrip transmission line referenced to a primary reference layer, the calculation of a second characteristic impedance of the dual referenced microstrip transmission line referenced to a secondary reference layer, the calculation of an absolute value of a difference between the first and the second characteristic impedance, the comparison of the absolute value of the difference to a predetermined threshold value, and if the absolute value of the difference is greater than the predetermined threshold value, then a physical parameter associated with the characteristic impedance between the primary and secondary reference layers may be varied until the difference is reduced to less than the predetermined threshold. A structure, according to one embodiment of the invention includes a microstrip transmission line, a first conductive plane, a first dielectric layer provided between the microstrip transmission line and the first conductive plane, a second conductive plane, and a second dielectric layer provided between the first conductive plane and the second conductive plane.

17 Claims, 6 Drawing Sheets

DUAL REFERENCED MICROSTRIP

FIELD OF THE INVENTION

The invention relates dual referenced microstrip structures for signal propagation in packages having semiconductor circuits.

BACKGROUND

As the speed of signals flowing between a packaged device and a printed circuit board to which it is coupled increases, the need to reduce signal discontinuities caused by changes in impedance between the package and the printed circuit board increases. Minimization of discontinuities allows for high bandwidth and high signal quality. Discontinuities include changes in impedance of a transmission line and/or signal reference of a transmission line over which a signal is traveling.

To ensure proper operation between various chips on a printed circuit board, manufacturers specify the characteristic impedance of signal paths running on or within the printed circuit board. Manufacturers also provide a tolerance for the characteristic impedance of these traces. For example, the characteristic impedance of system bus trace may be specified as being 50 Ohms±15%.

Various design guidelines have been developed to maintain trace impedance within specified tolerance on the printed circuit board. These guidelines are, by their nature, restrictive. One such guideline is the "Intel® Pentium® 4 Processor in 478-pin Package and Intel® 845 Chipset Platform Design Guide," which may be found at the Intel® Developer Web Site at http://developer.intel.com/design/chipsets/designex/29835401.pdf. The Intel® guideline describes a four layer printed circuit board design that includes two external signal layers (one each on a primary and secondary side, respectively) and two internal planes. One of the internal planes is usually a power plane (e.g., VCC) and the other internal plane is usually a continuous ground plane (e.g., VSS). The four planes lie parallel to each other; each separated from the other by a layer of dielectric. The guideline requires that the processor side bus signals on the four-layer printed circuit board maintain ground (e.g., VSS) as a reference plane. See Section 4.1, Processor System Bus Design Guidelines. By this constraint, the guideline seeks to ensure a continuous return path for an electrical signal traveling on the system bus both within the package and the printed circuit board. The return path is the route current takes to return to its source, otherwise known as the image current. It may take a path through, for example, ground planes, power planes, other signals, integrated circuits, passive components such as resistors or capacitors, and/or vias. By requiring system bus signals to reference ground the design guideline avoids discontinuities in characteristic impedance of a trace by clearly specifying an known and continuous reference.

A problem, however, is imposed on a printed circuit board layout when signal path routing is restricted to reference only the ground plane. This means, in a four layer printed circuit board, that the signal path layer can only be routed on one side of the printed circuit board, for example, the primary side, because, usually, only the primary side lies adjacent to the internal plane that has been designated as a ground plane. In that situation, signal paths cannot be placed on the secondary side because the secondary side's conductive layer lies adjacent to, and thus is referenced to, the internal plane that had been designated as the power plane layer. This constraint eliminates an entire conductive plane that could be used for signal path routing. Furthermore, this constraint on the layout of the printed circuit board results in escape and routing issues from a ball grid array ("BGA") component, or a pin grid array ("PGA") component, coupled to the printed circuit board within the BGA (or PGA) to printed circuit board interface area. These issues become increasingly significant as the density of microelectronics on the printed circuit board increase, and as the speed of the signals on the printed circuit board increase.

The difficulties imposed by typical guideline constraints, such as that mentioned above, have been addressed in the past by modifications to the printed circuit board. For example, in the four layer printed circuit board, rather than providing a unitary plane, the internal power plane layer may be populated by contiguous yet electrically isolated islands (frequently referred to as power plane flood areas); some of the islands may maintain their designation as the power plane layer while the remainder of the islands may be re-designated as ground plane areas. Traces on the component attachment layer may then be routed above the ground plane islands and are thus referenced to the ground plane. This solution is disfavored as segmentation of the power plane leads to a host of other problems. For example, the creation of ground plane islands on the power plane will result in significant challenges to delivering power on the printed circuit board from voltage regulator modules to respective components due to trace congestion, especially on areas close to the components.

Another modification may be to increase the number of layers in the printed circuit board, for example, from four to six layers. This is typically accomplished by designating the two outer layers as signal layers. Each outer signal layer references an adjacent internal ground plane. Additional internal power planes lie adjacent to the internal ground planes; one outer layer and one power plane each sandwich one ground plane. The six planes lie parallel to each other and are separated from one another by dielectric layers. While this solution can produce a very robust design, a six-layer printed circuit board tends to be prohibitively expensive to such industries as, for example, the high volume cost sensitive personal computer industry.

Other modifications to the printed circuit board may include applying finer printed circuit board design rules to provide for reduced diameter pads or reduced spacing between traces routed to the BGA or PGA. This has the effect of increasing the density of signal paths present on the signal path routing layer. Increased trace density, however, comes at the expense of increased cross-talk between traces. Another modification to the printed circuit board might be to increase the spacing between the lands that accept the BGA or PGA. This may provide for more traces to be interspersed between the BGA or PGA connectors, but it also requires a corresponding increase in package body size. While each of these modifications is applied to provide escape routing for all signal paths, they each result in increased overall system cost and complexity. Furthermore, they are all addressed toward changes in printed circuit board design and do not provide for improvements to package design.

BRIEF DESCRIPTION OF THE DRAWINGS

The various features of the invention will best be appreciated by simultaneous reference to the description which follows and the accompanying drawings, wherein like numerals indicate like elements, and in which.

DETAILED DESCRIPTION OF AN EMBODIMENT OF THE INVENTION

An embodiment of the invention, as disclosed herein, provides a solution to enable all signal paths for escape routing from, for example, a package while allowing both power plane and ground plane referencing on the printed circuit board. The solution involves use of a dual referenced microstrip structure to act as the transmission line for signal traces within, for example, the package. As used herein, a "trace" or "path" may be any transmission line carrying a signal such as a data, a clock, a control signal, among others. By controlling certain physical properties of the dual referenced microstrip structure, the difference between the characteristic impedance of the trace referenced to a primary reference plane and the same trace referenced to a secondary reference plane may be predicted and adjusted to fall within a predetermined acceptable range.

Thus, dual referenced traces may be achieved in microstrip, which is an improvement over past dual referencing techniques, which used stripline structures. A stripline structure sandwiches a conductive trace between two reference planes. Dielectric layers separate the reference planes from the conductive trace. In contrast, a microstrip structure comprises a top surface trace and a single reference plane. A dielectric layer separates the trace from the reference plane. Microstrip is a preferable structure in many cases, at least because of the accessibility of the trace and the reduced cost of the package. Microstrip is also a preferable structure, in some situations, as it allows for achievement of a given characteristic impedance that would otherwise be unavailable in a stripline configuration—given the same set of manufacturing capability constraints. For example, in microstrip and stripline structures built on dielectric substrates having the same dielectric constant and overall thickness, a stripline trace for a given characteristic impedance is narrower than a microstrip trace having the same characteristic impedance and thus may be more difficult to manufacture or more expensive to manufacture.

Figure 1:
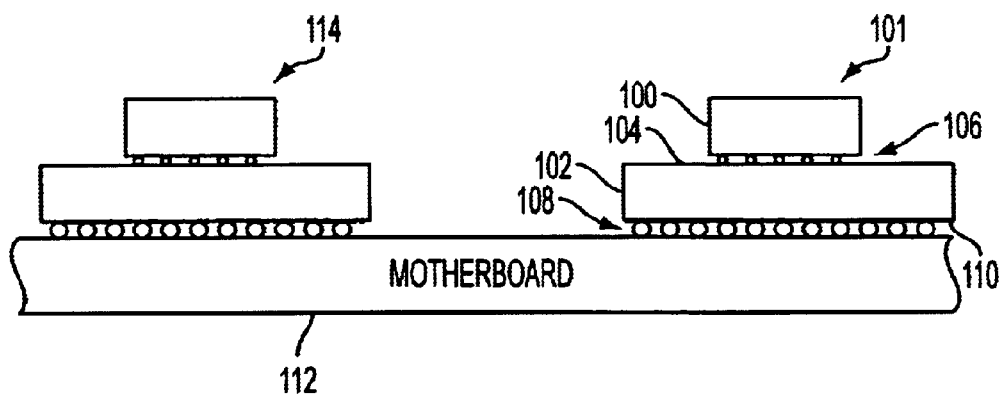
FIG. 1 illustrates a typical die/package/printed circuit board interface.

As used herein, a "package" refers to an electro-thermal-mechanical support structure for at least a semiconductor die. The package and the die together may be referred to as a "chip." FIG. 1 illustrates a typical die/package/printed circuit board interface. The die 100 may interface to the package 102 on a first side 104 of the package 102. The interface may be achieved, for example, by a plurality of solder bumps 106 in a die/package interface area. The die/package interface area is very congested; the solder bumps 106 may have a pitch of even smaller than 200 µm. Signal paths (e.g., system bus traces or 10 traces) typically fan out from the congested die/package interface area to the balls of a BGA 108 (or lands in a PGA, not shown). The BGA 108 is typically on a second side 110 of the package 102, the second side 110 being opposite to the first side 104. The balls of the BGA 108 may have a standard pitch, in accordance with current technology, of about 1 or 1.27 mm. The BGA 108 may interface to a printed circuit board 112. The BGA/printed circuit board interface area is also an area of congestion. This area is known as the escape area, because traces must escape from this area to be routed throughout the printed circuit board 112; often to other chips, such as chip 114.

Figure 2:
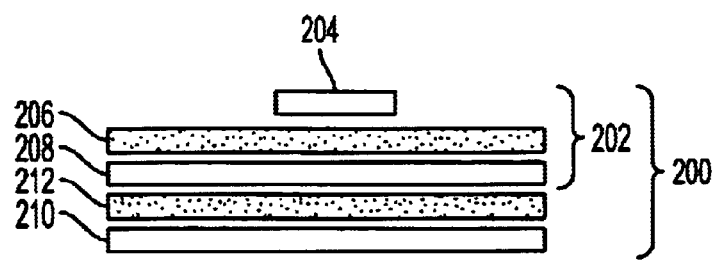
FIG. 2 illustrates a dual referenced microstrip configuration, in accordance with an embodiment of the invention.

FIG. 2 illustrates a "dual referenced microstrip" configuration 200 according to an embodiment of the present invention. A microstrip configuration 202 may be characterized by a signal path routing layer 204, supported by a first dielectric 206 adjacent to a primary reference layer 208. The signal path routing layer 204 is easily accessible. In a dual referenced microstrip configuration 200, a secondary reference layer 210 is positioned adjacent to the primary reference layer 208 and separated therefrom by a second dielectric layer 212. A problem with this configuration, however, has been that the characteristic impedance of the signal path routing layer 204, referenced to the primary reference layer 208 was generally believed to be different from the characteristic impedance of the signal path routing layer 204 referenced to the secondary reference layer 210; this difference was unpredictable and could vary according to manufacturing techniques, among other things.

Thus, in the past, in applications where dual referenced signals were required in a particular design based on printed circuit board design requirements the known stripline configuration would have been chosen to be implemented in the package in order to provide the required dual referencing characteristics. However, the stripline structure itself is not a preferred structure. This is so because at least of the difficulty in making connections to the stripline trace, which, unlike microstrip, is sandwiched between two reference planes and two dielectric layers as well as the difficulty in achieving certain characteristic impedances in a stripline design.

The inventors of the invention herein have discovered a way to overcome the difficulty in predicting and controlling the difference in characteristic impedance of a trace in a dual referenced microstrip configuration. The inventors have discovered a way to mathematically characterize the difference in characteristic impedance of a trace referenced to a primary plane versus a secondary plane. By doing so, they are able to adjust physical parameters of the package in order to reduce the difference to a level within the tolerance imposed on trace characteristic impedance.

Figure 3:
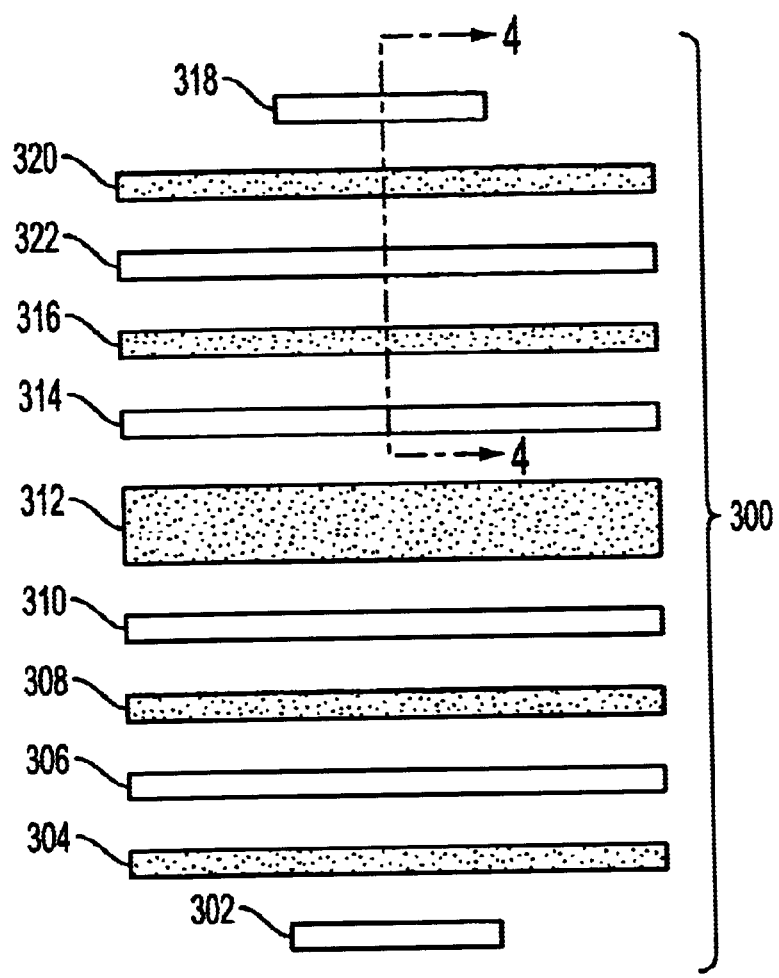
FIG. 3 illustrates an arrangement for a dual referenced transmission line in the signal path routing layer in a microstrip package stackup, in accordance with the embodiment of the invention.

FIG. 3 illustrates an example of a six-layer package stackup 300 including a dual referenced microstrip transmission line in the signal path routing layer 318 (similar to 204 FIG. 2). The package stackup 300 includes: a bottom conductive plane 302, which may be used for example, for LGA/Routing; a first dielectric layer 304; a ground layer 306, which may be a VSS plane; a second dielectric layer 308, a power plane layer 310, which may be a VCC plane; a dielectric core 312; a secondary reference layer 314, which may be a power plane (e.g., VCC) layer; a third dielectric layer 316; a primary reference layer 322, which may be a ground plane (e.g., VSS) layer; a fourth dielectric layer 320, and a signal routing layer 318.

A dual referenced microstrip transmission line, as shown in the embodiment of FIG. 3, can meet characteristic impedance tolerances by manipulation of physical parameters associated with the two planes to which the microstrip trace is referenced (i.e., primary reference layer 322 and secondary reference layer 314). By the use of equations disclosed herein, the difference in impedance of a microstrip trace on the signal routing layer 318 referenced to the primary reference layer 322 as compared to the microstrip trace referenced to the secondary reference layer 314 can be calculated. By manipulation of physical parameters associated with the primary and secondary reference layers 322, 314, respectively, the difference in characteristic impedance can be reduced to a value that is within the overall tolerance imposed on the microstrip characteristic impedance.

Physical parameters that can be manipulated include, but are not limited to: the thickness of the dielectric layer separating the two reference planes; the relative dielectric constant of the dielectric separating the two reference planes; the surface area of the adjacent reference planes; the thickness of the conductive reference plane materials; the type of conductive reference plane materials; placement of discrete capacitors shunting the two reference planes; and the number of connections (e.g., number of balls in the BGA) which the package makes to the die and printed circuit board.

The characteristic impedance, $Z_0$, of a lossless transmission line may be approximated by the equation:

$$Z_0 = \sqrt{\frac{L}{C}},$$

where L is the inductance between the reference plane and the trace per unit length and C is the capacitance between the reference plane and the trace per unit length.

Figure 4A:
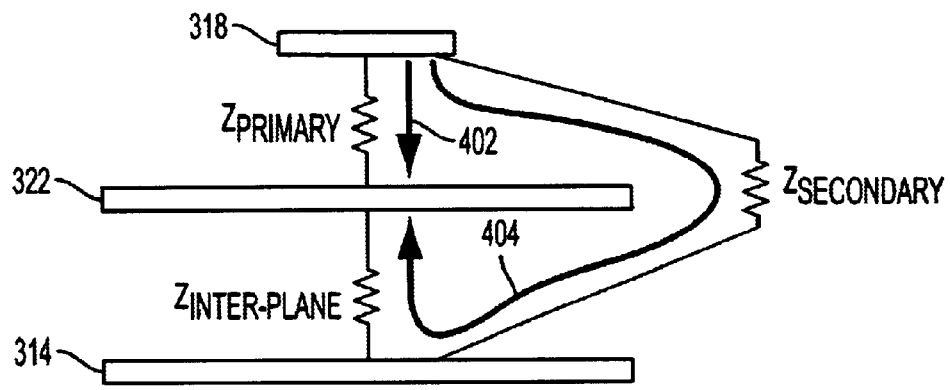
FIG. 4A is a cross sectional view of plane 4—4 in FIG. 3 showing a first current flow in accordance with an embodiment of the invention.
Figure 4B:
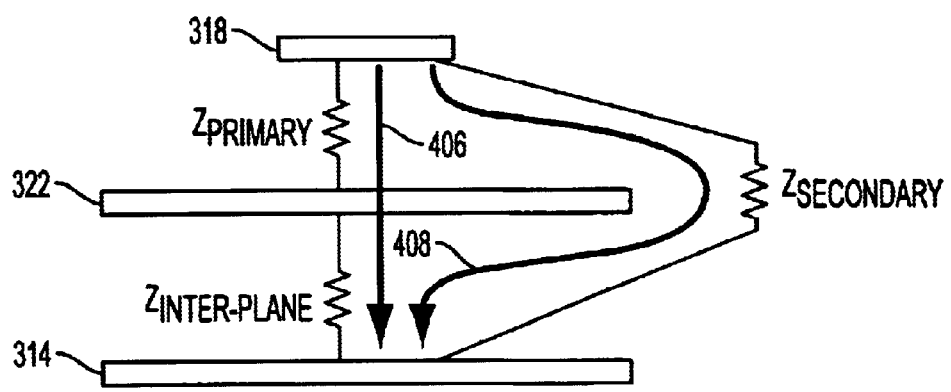
FIG. 4B is a cross sectional view of plane 4—4 in FIG. 3 showing a second current flow in accordance with an embodiment of the invention.

FIGS. 4A and 4B are cross sectional views of plane 4—4 in FIG. 3. FIGS. 4A and 4B illustrate that components of impedance present in a dual referenced microstrip structure may be expressed as $Z_{PRIMARY}$, $Z_{SECONDARY}$, and $Z_{INTER-PLANE}$, where:

$$Z_{PRIMARY} = \sqrt{\frac{L_{PRIMARY}}{C_{PRIMARY}}}$$

= the characteristic impedance between the signal path and the primary reference plane;

$$Z_{SECONDARY} = \sqrt{\frac{L_{SECONDARY}}{C_{SECONDARY}}}$$

= the characteristic impedance between the signal path and the secondary reference plane; and $$Z_{INTER-PLANE} = \sqrt{\frac{L_{INTER-PLANE}}{C_{INTER-PLANE}}}$$

= the characteristic impedance between the primary and secondary reference planes.

FIG. 4A illustrates a first return path 402 and a second return path 404 through which return current may flow if the signal path 318 is referenced to the primary reference layer 322. FIG. 4B illustrates a third return path 406 and a fourth return path 408 through which return current may flow if the signal path 318 is referenced to the secondary reference layer 314. In FIGS. 4A and 4B, the dielectric layers 316 and 320 have been omitted for clarity.

As is known in the art, as two conductive planes, such as secondary reference layer 314 and primary reference layer 322, approach each other, the capacitance between them rises to a large value and the inductance between them falls to a small value, as such $Z_{INTER-PLANE}$ becomes negligible and may be discounted. Further, because the capacitance between the signal path and the secondary reference plane is essentially zero, $Z_{SECONDARY}$ grows to a very large value and may be replaced by a computational estimate of infinity.

With reference to FIG. 4A, the characteristic impedance of a dual referenced microstrip trace 318 referenced to the primary reference layer 322 may be given by:

$Z_0 = (Z_{SECONDARY} + Z_{INTER-PLANE}) \| Z_{PRIMARY}$, which, if reduced in accordance with the approximations identified above results in:

$Z_0 = Z_{PRIMARY}$.

With reference to FIG. 4B, the characteristic impedance of a dual-referenced microstrip trace 318 referenced to the secondary reference layer 314 may be given by:

$Z_0 = (Z_{PRIMARY} + Z_{INTER-PLANE}) \| Z_{SECONDARY}$, which, if reduced in accordance with the approximations identified above results in:

$Z_0 = Z_{PRIMARY} + Z_{INTER-PLANE}$.

Those of skill in the art will understand that other naming conventions for the primary and secondary layers may be adopted without changing the scope of the invention. Further, the primary or secondary reference layers may be designated as ground, power, or some other reference without changing the scope of the invention. Additionally, the primary and secondary layers may be interchanged in physical order from that described in this exemplary embodiment. If the primary and secondary layers are interchanged in physical order from that described in this exemplary embodiment, then the equations above will be altered by interchanging the designators $Z_{PRIMARY}$ and $Z_{SECONDARY}$. Such changes to the equations above are within the skill of those of ordinary skill in the art.

Thus, the difference in characteristic impedance of the dual referenced microstrip trace 318 when referenced to the primary reference layer 322, as compared to the trace 318 when referenced to secondary reference layer 314 may simply be the characteristic impedance between the primary reference layer 322 and the secondary reference layer 314, i.e., $Z_{INTER-PLANE}$.

Design guidelines will often specify target impedance values as well as tolerances on those values. For example, the Intel® 845 Chipset Design Guide specifies target board characteristic impedance of 50 Ohms±15% with a 7 mil nominal trace width. This illustration is merely exemplary; chipsets or circuits operating at other frequencies may have other tolerances defined for them.

In one exemplary embodiment, by using primary and secondary reference layers in the configuration of FIG. 3, with spacing between the primary and secondary layers on the order of 30 µm and a dielectric constant of 3.4, the inventors are able to maintain an impedance difference between the trace 318 referenced to the primary reference plane 322 and the trace 318 referenced to the secondary reference plane 314 of less than 2.0 Ohms for a frequency range up to 1 GHz. This corresponds to a tolerance on a 50 Ohm impedance of less than ±2.0%.

An embodiment of the invention disclosed herein allows for circuits to be redesigned from dual referenced stripline to dual referenced microstrip, a redesign which, in the past, would not have been considered because of the differences in characteristic impedance of signal paths as mentioned above. For example, the first generation Intel® Pentium® 4 processor processor side bus (PSB) uses a dual referenced stripline design on the CPU as well as its associated family of chipsets. Replacing the dual referenced stripline with dual referenced microstrip in this instance would allow for easier design layout by virtue of the microstrip trace topside accessibility as well as the fact that in current package manufacturing processes microstrip trace routes of desirable characteristic impedance are easier to manufacture and thus may be cheaper.

Another example in which dual referenced microstrip could be used where previously it was thought not to have been feasible is in CMOS applications. In CMOS it is desirable to have the interconnects (traces) in a dual referenced configuration. In the past, this was done with stripline design. Now it will be possible, and is desirable and useful, to replace the dual referenced stripline with dual referenced microstrip.

Another improvement that can be realized through the redesign of existing circuits using dual referenced microstrip is the reduction in the number of layers of printed circuit boards. This reduction could be realized in printed circuit boards that could not enable all signal routing due to restrictions on signal path layers imposed by chip manufacturers or practical design considerations. Furthermore, new printed circuit boards can be designed with greater ease, and fewer layers, if reference plane restrictions are not imposed on their designs.

One advantage of dual referenced microstrip package routing as compared to dual referenced stripline package routing is the benefit of dual referencing of a signal yet also embodying the advantages of microstrip routing. Advantages of microstrip routing may include ease of manufacturability of desired trace characteristic impedance, for example 50 ohms nominal transmission lines, with lower cost on a particular package manufacturing technology. Other advantages of microstrip routing may include accessibility of traces to physical probing or trace routing flexibility. In the past it was generally believed that the only way to get an effective dual referenced signal trace was to use a stripline design, the dual referenced microstrip routing technique provides an alternative dual referenced routing mechanism which may have advantages for various designs depending upon the application.

Figure 5:
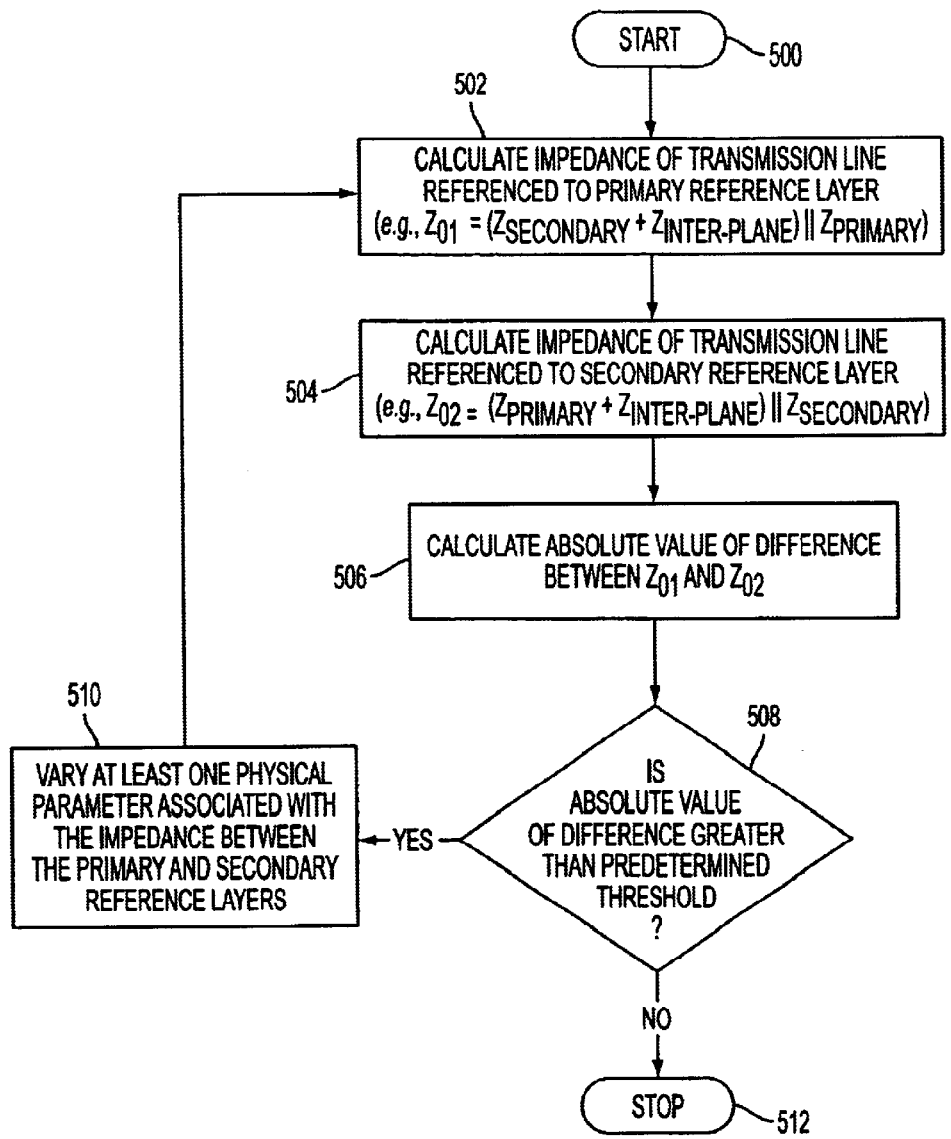
FIG. 5 is a flowchart presenting a method of designing a dual referenced microstrip transmission line in accordance with an embodiment of the invention.

FIG. 5 is a flowchart presenting a method of designing a dual referenced microstrip transmission line. The method may start at step 500. At step 502, the impedance of the dual referenced transmission line 318 referenced to the primary reference plane 322 may be calculated. The characteristic impedance may be calculated according to the equation set forth above, specifically, $Z_{01} = (Z_{SECONDARY} + Z_{INTER-PLANE}) \| Z_{PRIMARY}$, where $Z_{01}$ represents the characteristic impedance of the transmission line referenced to the primary reference plane. At step 504, the characteristic impedance of the dual referenced transmission line 318 referenced to the secondary reference plane 314 is calculated. The characteristic impedance may be calculated according to the equation set forth above, specifically, $Z_{02} = (Z_{PRIMARY} + Z_{INTER-PLANE}) \| Z_{SECONDARY}$, where $Z_{02}$ represents the characteristic impedance of the transmission line referenced to the secondary reference plane. Of course, other equations may be used to arrive at the characteristic impedances of $Z_{01}$ and/or $Z_{02}$. At step 506, the absolute value of the difference between $Z_{01}$ and $Z_{02}$ may be calculated. At step 508, the calculated absolute value of the difference is compared to a predetermined threshold value; if the absolute value of the difference is greater than the predetermined threshold value, then, at step 510, at least one physical parameter associated with the impedance between the two reference planes may be adjusted. In accordance with one exemplary embodiment of the invention, the predetermined threshold value may be less than 2 Ohms for frequencies less than 1 GHz. Physical parameters that may be adjusted include, but are not limited to the thickness of the dielectric layer separating the two reference planes; the relative dielectric constant of the dielectric separating the two reference planes; the surface area of the adjacent reference planes; the thickness of the conductive reference plane materials; the type of conductive reference plane materials; placement of discrete capacitors shunting the two reference planes; and the number of connections (e.g., number of balls in the BGA) which the package makes to the die and printed circuit board. After step 510, the method may return to step 502. If the absolute value of the difference between $Z_{01}$ and $Z_{02}$ is less than or equal to the predetermined threshold value, then the method may end at step 512.

A method of fabricating a circuit board for a microelectronic package may be comprised of depositing a first conductive layer on a dielectric core; building up first dielectric layer on top of the first conductive layer, the first dielectric layer having a thickness of between 20 to 50 microns; depositing a second conductive layer on top of the first dielectric layer; building up a second dielectric layer on top of the second conductive layer; and depositing at least one conductive transmission line structure on top of the second dielectric layer, wherein the first and second conductive layers are used as reference planes for the transmission line structure and wherein the difference in impedance between the transmission line structure referenced to the first conductive layer and the transmission line structure referenced to the second conductive layer is proportional to the impedance between the first and second conductive layers. The impedances may, of course, be calculated in accordance with the equations described herein.

Figure 6:
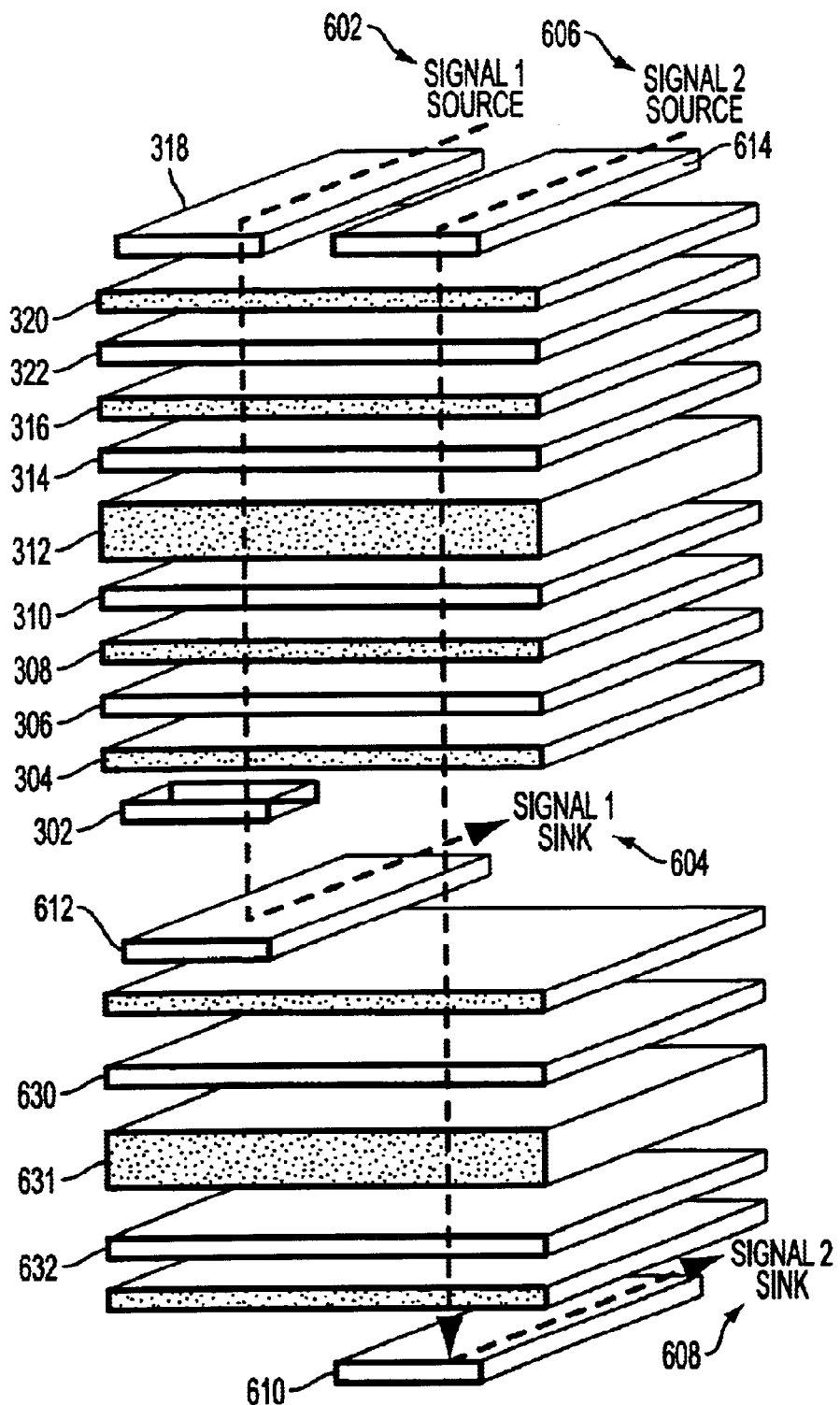
FIG. 6 is a representation of a stackup of layers as used in a computer simulated circuit in accordance with an embodiment of the invention.

FIG. 6 is representation of a stackup used in a computer simulation to illustrate the lack of signal distortion as seen by a first signal as the first signal propagates from a source 602 (e.g., a die (not shown)), along 2 cm of 54 µm wide first trace 318 in a package, through vias and BGA (not shown), and then along 4 cm of 5 mil wide first trace on a printed circuit board component attachment layer trace 612 until it finally reaches a sink 604 (e.g., a termination (not shown)). A second signal propagates from a source 606 (e.g., a die (not shown)), along 2 cm of 54 µm wide second trace 614 in the package, through vias and BGA (not shown), and then along 4 cm of 5 mil wide second trace on a printed circuit board IO trace routing layer 610 until it reaches a sink 608 (e.g., a termination (not shown)). For the simulation, the relative dielectric constant ("Er") of the printed circuit board dielectric is 4, while the Er of the package dielectric is 3.4. The first signal is configured in a dual referenced microstrip configuration and thus referenced to both the primary reference layer 322 and the secondary reference layer 314 in the package, the first signal is referenced predominately to the primary reference layer 630 on the printed circuit board due to the very thick printed circuit board dielectric core 631. The second signal is configured in a dual referenced microstrip configuration and thus referenced to both the primary reference layer 322 and the secondary reference layer 314 in the package in the same manner as the first signal, the second signal is referenced predominately to the secondary reference layer 632 on the printed circuit board due to the very thick printed circuit board dielectric core 631.

Figure 7:
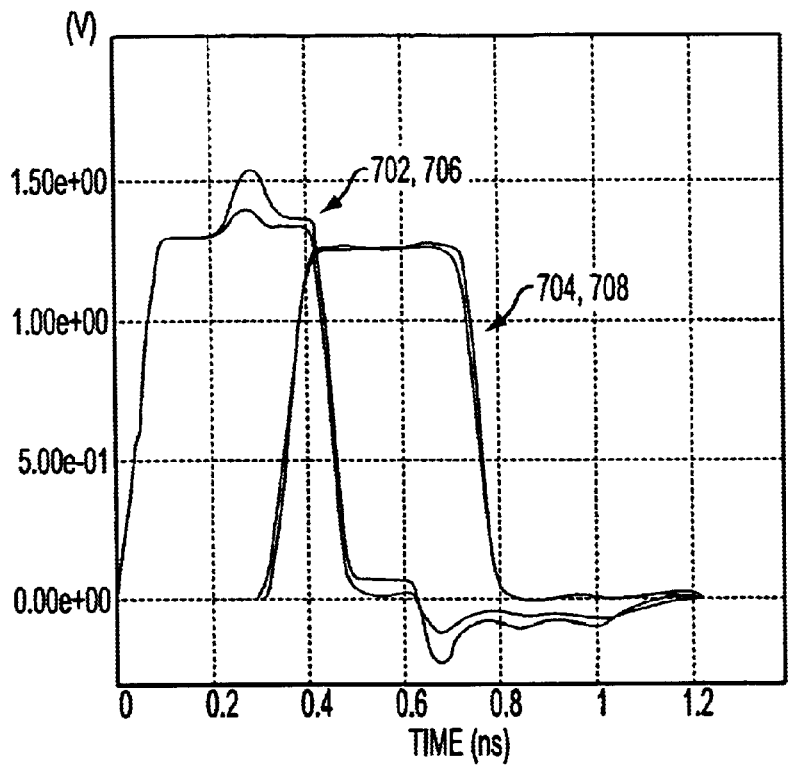
FIG. 7 is a graphic representation of the results of a first simulation using the stackup of FIG. 6, in accordance with an embodiment of the invention.

FIG. 7 is a graphic representation of the results of the simulation using the stackup representation of FIG. 6. For the simulation, a single square pulse of 1.25 V amplitude, having rise and fall times of 100 ps, a pulse width of 300 ps, and a period of 1 ns was applied to nodes 602 and 606. The input pulses 702 and 706 are illustrated in FIG. 7. Each input pulse 702, 706 exhibits a high hump due to the relatively lengthy via the signals traveled through to reach from one side of the package to the other. FIG. 7 also illustrates the shape of the signals at the sink nodes 604, 608 on the printed circuit board. As shown in FIG. 7, neither the first signal 704 nor the second signal 708 exhibits noticeable distortion. Distortion is not present and signal quality of both signals is similar although the first signal was referenced to only the primary reference plane 630 on the printed circuit board while the second signal was referenced to only the secondary reference plane 632 on the printed circuit board and both signals had the same reference configuration in the package.

Figure 8:
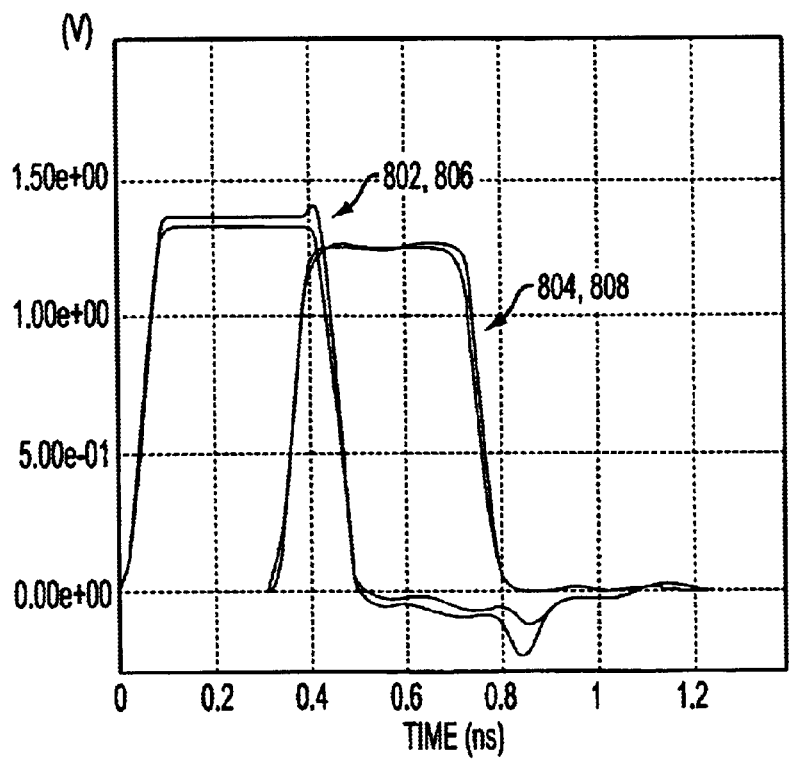
FIG. 8 is a graphic representation of the results of a second simulation using the stackup of FIG. 6, in accordance with an embodiment of the invention.

FIG. 8 is a graphic representation of the results of a simulation similar to that illustrated by FIGS. 6 and 7, except that the results of FIG. 8 were obtained using signals sourced at the printed circuit board and terminated on the package. As shown in FIG. 8, neither the first signal 804 nor the second signal 808 exhibits noticeable distortion. Distortion is not present and signal quality of both signals is similar although the first signal was referenced to only the primary reference plane 630 on the printed circuit board while the second signal was referenced to only the secondary reference plane 632 on the printed circuit board and both signals had the same reference configuration in the package.

The disclosed embodiments are illustrative of the various ways in which the present invention may be practiced. Other embodiments can be implemented by those skilled in the art without departing from the spirit and scope of the present invention.

What is claimed is:

1. A method of designing a dual referenced microstrip transmission line, comprising:
   calculating a first characteristic impedance of the dual referenced microstrip transmission line referenced to a primary reference layer;
   calculating a second characteristic impedance of the dual referenced micro strip transmission line referenced to a secondary reference layer;
   calculating an absolute value of a difference between the first and the second characteristic impedance;
   comparing the absolute value of the difference to a predetermined threshold value; and if the absolute value of the difference is greater than the predetermined threshold value, then
   varying a physical parameter associated with the characteristic impedance between the primary and secondary reference layers until the difference is reduced to less than the predetermined threshold.

2. The method of claim 1, wherein the first characteristic impedance of the dual referenced microstrip transmission line is given by the equation $$Z_{01}=(Z_{SECONDARY} \pm Z_{INTER\text{-}PLANE}) \| Z_{PRIMARY},$$

where:
   $Z_{PRIMARY}$ is a characteristic impedance of the microstrip transmission line referenced to the primary reference plane adjacent thereto,
   $Z_{SECONDARY}$ is a characteristic impedance of the microstrip transmission line referenced to the secondary reference layer adjacent to the primary reference layer, and
   $Z_{INTER\text{-}PLANE}$ is a characteristic impedance of the primary reference layer referenced to the secondary reference layer.

3. The method of claim 1, wherein the second characteristic impedance of the dual referenced microstrip transmission line is given by the equation $$Z_{02}=(Z_{PRIMARY}+Z_{INTER\text{-}PLANE}) \| Z_{SECONDARY},$$

where:
   $Z_{PRIMARY}$ is a characteristic impedance of the microstrip transmission line referenced to the primary reference plane adjacent thereto,
   $Z_{SECONDARY}$ is a characteristic impedance of the microstrip transmission line referenced to the secondary reference layer adjacent to the primary reference layer, and
   $Z_{INTER\text{-}PLANE}$ is a characteristic impedance of the primary reference layer referenced to the secondary reference layer.

4. The method of claim 1, wherein the first characteristic impedance of the dual referenced microstrip transmission line is given by the equation $$Z_{01}=Z_{PRIMARY},$$

where:
   $Z_{PRIMARY}$ is a characteristic impedance of the microstrip transmission line referenced to the primary reference plane adjacent.

5. The method of claim 1, wherein the second characteristic impedance of the dual referenced microstrip transmission line is given by the equation $$Z_{02}=Z_{PRIMARY}+Z_{INTER\text{-}PLANE},$$

where:
   $Z_{PRIMARY}$ is a characteristic impedance of the microstrip transmission line referenced to the primary reference plane adjacent, and
   $Z_{INTER\text{-}PLANE}$ is a characteristic impedance of the primary reference layer referenced to the secondary reference layer.

6. The method of claim 1, further comprising fabricating the microstrip transmission line in one of: a package, a substrate, a printed circuit board, and an integrated circuit.

7. The method of claim 1, wherein the absolute value of the difference between characteristic impedance is substantially equal to the absolute value of the characteristic impedance between the primary and secondary reference layers.

8. The method of claim 1, wherein the physical parameter is one of: a thickness of a dielectric layer separating the primary and secondary reference layers; a relative dielectric constant of a dielectric layer separating the primary and secondary reference layers; a conductive surface area of the primary and secondary reference layers; a thickness of a conductive surface of one of the primary and secondary reference layers; a type of material used for the conductive surface of the primary and secondary reference layers; and a location of placement of a discrete capacitor shunting the primary and secondary reference layers.

9. A machine-readable medium having stored thereon a plurality of executable instructions, the plurality of instructions comprising instructions to:
  calculate a first characteristic impedance of a dual referenced microstrip transmission line referenced to a primary reference layer;
  calculate a second characteristic impedance of the dual referenced microstrip transmission line referenced to a secondary reference layer;
  calculate an absolute value of a difference between the first and the second characteristic impedance;
  compare the absolute value of the difference to a predetermined threshold value; and if the absolute value of the difference is greater than the predetermined threshold value, then
  vary a physical parameter associated with the characteristic impedance between the primary and secondary reference layers until the difference is reduced to less than the predetermined threshold.

10. The machine readable medium of claim 9, wherein the instructions to calculate the first characteristic impedance of the dual referenced microstrip transmission line referenced to the primary reference layer include instructions to calculate the characteristic impedance according to the equation $$Z_{o1} = (Z_{SECONDARY} + Z_{INTER-PLANE}) \| Z_{PRIMARY},$$

where:
  $Z_{PRIMARY}$ is a characteristic impedance of the microstrip transmission line referenced to the primary reference plane adjacent thereto,
  $Z_{SECONDARY}$ is a characteristic impedance of the microstrip transmission line referenced to the secondary reference layer adjacent to the primary reference layer, and
  $Z_{INTER-PLANE}$ is a characteristic impedance of the primary reference layer referenced to the secondary reference layer.

11. The machine readable medium of claim 9, wherein the instructions to calculate the second characteristic impedance of the dual referenced microstrip transmission line referenced to the second reference layer include instructions to calculate the characteristic impedance according to the equation $$Z_{o2} = (Z_{PRIMARY} + Z_{INTER-PLANE}) \| Z_{SECONDARY},$$

where:
  $Z_{PRIMARY}$ is a characteristic impedance of the microstrip transmission line referenced to the primary reference plane adjacent thereto,
  $Z_{SECONDARY}$ is a characteristic impedance of the microstrip transmission line referenced to the secondary reference layer adjacent to the primary reference layer, and
  $Z_{INTER-PLANE}$ is a characteristic impedance of the primary reference layer referenced to the secondary reference layer.

12. The machine readable medium of claim 9, wherein the instructions to calculate the first characteristic impedance of the dual referenced microstrip transmission line referenced to the primary reference layer include instructions to calculate the characteristic impedance according to the equation $$Z_{o1} = Z_{PRIMARY},$$

where:
  $Z_{PRIMARY}$ is a characteristic impedance of the micro strip transmission line referenced to the primary reference plane adjacent thereto.

13. The machine readable medium of claim 9, wherein the instructions to calculate the second characteristic impedance of the dual referenced microstrip transmission line referenced to the second reference layer include instructions to calculate the characteristic impedance according to the equation $$Z_{o2} = Z_{PRIMARY} + Z_{INTER-PLANE},$$

where:
  $Z_{PRIMARY}$ is a characteristic impedance of the microstrip transmission line referenced to the primary reference plane adjacent, and
  $Z_{INTER-PLANE}$ is a characteristic impedance of the primary reference layer referenced to the secondary reference layer.

14. A semiconductor package having a trace designed as a dual referenced microstrip structure, comprising:
  a microstrip transmission line;
  a first conductive plane;
  a first dielectric layer provided between the microstrip transmission line and the first conductive plane;
  a second conductive plane; and
  a second dielectric layer provided between the first conductive plane and the second conductive plane, wherein an absolute value of a difference between a characteristic impedance of the microstrip transmission line referenced to the first conductive plane and the characteristic impedance of the microstrip transmission line referenced to the second conductive plane is less than a predetermined percentage of a nominal characteristic impedance of the microstrip transmission line.

15. The semiconductor package of claim 14, wherein the predetermined percentage of the nominal characteristic impedance of the microstrip transmission line is ±2.0% of 50 Ohms.

16. A semiconductor package having a trace designed as a dual referenced microstrip structure, comprising:
  a microstrip transmission line;
  a first conductive plane;
  a first dielectric layer provided between the microstrip transmission line and the first conductive plane;
  a second conductive plane; and
  a second dielectric layer provided between the first conductive plane and the second conductive plane, wherein the characteristic impedance of a transmission line in the dual referenced microstrip structure referenced to a first reference plane minus the characteristic impedance referenced to a second reference plane is less than a predetermined value.

17. The semiconductor package of claim 16, wherein the predetermined value is two Ohms.

* * * * *

UNITED STATES PATENT AND TRADEMARK OFFICE
CERTIFICATE OF CORRECTION

PATENT NO.   : 6,686,819 B2
DATED        : February 1, 2002
INVENTOR(S)  : Breisch et al.

It is certified that error appears in the above-identified patent and that said Letters Patent is hereby corrected as shown below:

Column 10,
Line 7, change "$(Z_{SECONDARY} \pm Z_{INTERPLANE})$" to -- $(Z_{SECONDARY} + Z_{INTERPLANE})$ --.

Column 11,
Line 56, change "$(Z_{02}=(Z_{PRIMARY} + Z_{INTER\text{-}PLANE}) \| Z_{SECONDARY},$" to -- $(Z_{02}=(Z_{PRIMARY} + Z_{INTER\text{-}PLANE}) \| Z_{SECONDARY},$ --.

Signed and Sealed this

Twenty-third Day of November, 2004

JON W. DUDAS
*Director of the United States Patent and Trademark Office*